United States Patent
Naka et al.

(10) Patent No.: US 6,636,109 B2
(45) Date of Patent: Oct. 21, 2003

(54) AMPLIFICATION CIRCUIT WITH CONSTANT OUTPUT VOLTAGE RANGE

(75) Inventors: Naoaki Naka, Kawasaki (JP); Junko Nakamoto, Kawasaki (JP); Yanyan Qiao, Hino (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/095,944

(22) Filed: Mar. 13, 2002

(65) Prior Publication Data
US 2003/0042973 A1 Mar. 6, 2003

(30) Foreign Application Priority Data
Aug. 30, 2001 (JP) .......................................... 2001-261967

(51) Int. Cl.[7] .................................................. H03F 3/45
(52) U.S. Cl. .......................... 327/563; 327/327; 327/65; 327/331; 330/254
(58) Field of Search ............................... 327/59, 65, 89, 327/307, 331, 563; 330/136, 254, 261

(56) References Cited

U.S. PATENT DOCUMENTS 5,381,113 A * 1/1995 Kimura ....................... 330/253
5,602,509 A * 2/1997 Kimura ....................... 330/253
6,218,902 B1 * 4/2001 Kung ........................... 330/261

FOREIGN PATENT DOCUMENTS

JP      62-040814      2/1987      ........... H03H/11/26

* cited by examiner

Primary Examiner—Timothy P. Callahan
Assistant Examiner—Terry L. Englund
(74) Attorney, Agent, or Firm—Arent Fox Kintner Plotkin & Kahn PLLC

(57) ABSTRACT

An amplification circuit of the present invention includes a first MOS transistor having a gate to which a first input terminal for inputting a positive logic input signal or a reference potential is connected and a drain to which a first load is connected, a second MOS transistor having a gate to which a second input terminal for inputting a negative logic input signal, which composes differential input signals with the positive logic signal, or the reference potential is connected and a drain to which an output terminal and a second load are connected, and pairing up with the first MOS transistor, and a current source to which sources of the first and second MOS transistors are connected, for supplying a constant current when the difference in voltage between the first and second input terminals is in a predetermined range, and varying the current to be supplied when the difference in voltage is beyond the predetermined range.

20 Claims, 9 Drawing Sheets

AMPLIFICATION CIRCUIT WITH CONSTANT OUTPUT VOLTAGE RANGE

CROSS-REFERENCE TO RELATED APPLICATIONS

This application is based upon and claims priority of Japanese Patent Application No. 2001-261967, filed on Aug. 30, 2001, the contents being incorporated herein by reference.

BACKGROUND OF THE INVENTION

1. Field of the Invention

The present invention relates to an amplification circuit, and particularly to an amplification circuit for outputting from its output terminal a voltage in accordance with voltages inputted to its first and second input terminals.

2. Description of the Related Art

FIG. 7A shows a circuit of an operational amplifier in a prior art.

An n-channel MOS (metal-oxide-semiconductor) transistor 702a has a gate connected to a positive logic input terminal IN, a source connected to one end of a constant current source 703, and a drain connected to one end of a load 701a. The other end of the constant current source 703 is connected to a ground potential. The other end of the load 701a is connected to a positive power source potential Vdd.

An n-channel MOS transistor 702b has a gate connected to a negative logic input terminal XIN, a source connected to the aforesaid one end of the constant current source 703, and a drain connected to an output terminal OUT and one end of a load 701b. The other end of the load 701b is connected to the power source potential Vdd.

A positive logic input signal Vin which is inputted to the positive logic input terminal IN and a negative logic input signal Vxin which is inputted to the negative logic input terminal XIN mutually compose differential signals. In other words, both signals are signals whose logics are opposite to each other.

FIG. 7B is a chart showing the operation of the operational amplifier in FIG. 7A. The horizontal axis represents a differential voltage Vin−Vxin and the vertical axis represents currents Isrc and Iout and a voltage Vout. The current Isrc is a current flowing through the current source 703 and is constant regardless of the differential voltage Vin−Vxin. The current Iout is a current flowing through the load 701b and varies lineally in accordance with the differential voltage Vin−Vxin in a predetermined range. The output voltage Vout is a voltage of the output terminal OUT. When a resistance value of the load 701b is shown by R, the output voltage Vout is expressed by the following formula.

$$Vout = Vdd - Iout \times R$$

FIG. 8 shows a circuit of another operational amplifier in the prior art. In this operational amplifier, p-channel MOS transistors 801a and 801b are provided in place of the loads 701a and 701b in FIG. 7A so that the gain of the output voltage Vout can be increased. The p-channel MOS transistor 801a has a source connected to the power source potential Vdd and a drain connected to the drain of the n-channel MOS transistor 702a. The p-channel MOS transistor 801b has a source connected to the power source potential Vdd and a drain connected to the drain of the n-channel MOS transistor 702b. Gates of the transistors 801a and 801b are connected to the drain of the transistor 702a.

For example, when the positive logic input signal Vin becomes larger, a current flowing through the transistor 801a increases and a voltage of the drain of the transistor 702a decreases. Then, a gate voltage of the transistor 801a decreases and the current flowing through the transistor 801a further increases. As a result, a current flowing through the transistor 801b decreases and an output voltage of the output terminal OUT further increases so that the high gain can be obtained.

FIG. 9 shows a circuit of still another operational amplifier in the prior art. In this operational amplifier, an n-channel MOS transistor 901 is provided in place of the current source 703 of the operational amplifier in FIG. 7A so that the gain of the output voltage Vout can be increased. The transistor 901 has a gate connected to the drain of the transistor 702a, a source connected to the ground potential, and a drain connected to the sources of the transistors 702a and 702b.

For example, when the positive logic input signal Vin becomes larger, a current flowing through the transistor 702a increases and the voltage of the drain of the transistor 702a decreases. Then, a gate voltage of the transistor 901 decreases and a current flowing through the transistor 901 decreases. As a result, a current flowing through the transistor 702b also decreases and the output voltage Vout of the output terminal OUT increases so that the high gain can be obtained.

The operational amplifier as described above is used for a small-amplitude input circuit so as to receive a signal from the outside and amplify it. Some small-amplitude input circuits receive data and a clock simultaneously.

As shown in FIG. 10, however, a clock 1001 has a high frequency compared with that of data 1002 and, when a waveform becomes deformed due to signal propagation, the signal amplitude becomes smaller. For example, the clock 1001 is a binary logic signal whose low level is 1 V and high level is 2 V, while the data 1002 is a binary logic signal whose low level is 0 V and high level is 3.3 V.

In this case, even if the clock 1001 and the data 1002 start falling simultaneously at time t1, delay time Td occurs between the clock 1001 and the data 1002. In other words, if the amplitude of the clock 1001 and the data 1002 are different, the delay time Td occurs between the clock 1001 and the data 1002. Further, there is a problem that the delay time Td varies depending on the magnitude of the amplitude of the signals.

As shown in FIG. 7B, the aforesaid operational amplifier can output the output voltage Vout in a range from 0 to Vdd V. If the amplitude of the input signals Vin and Vxin are small, the amplitude of the output voltage Vout is also small, and if the amplitude of the input signals Vin and Vxin are large, the amplitude of the output voltage Vout is also large. As shown in FIG. 10, the signal 1001 of 1 to 2 V is outputted and the signal 1002 of 0 to 3.3 V is outputted in accordance with the amplitude of the input signals Vin and Vxin.

SUMMARY OF THE INVENTION

It is an object of the present invention to provide an amplification circuit capable of outputting an output voltage having the constant amplitude regardless of the magnitude of the amplitude of an input signal.

According to an aspect of the present invention, provided is an amplification circuit comprising: a first MOS transistor having a gate to which a first input terminal for inputting a positive logic input signal or a reference potential is connected and a drain to which a first load is connected; a second MOS transistor having a gate to which a second input terminal for inputting a negative logic input signal, which composes differential input signals with the positive logic input signal, or the reference potential is connected and a drain to which an output terminal and a second load is connected, and pairing up with the first MOS transistor; and a current source to which sources of the first and second MOS transistors are connected, for supplying a constant current to the first and/or second load when the difference in voltage between the first and second input terminals is in a predetermined range, and varying the current to be supplied to the first and/or second load when the difference in voltage is beyond the predetermined range.

The current source supplies the constant current to the first and/or second load when the difference in voltage between the first and second input terminals is in the predetermined range, while varies the current to be supplied to the first and/or second load when the difference in voltage is beyond the predetermined range so that a voltage of the output terminal can be controlled at a constant value when the difference in voltage is beyond the predetermined range. As a result, when the amplitude of the input signal is large, the amplitude is controlled so that an output signal constantly having the same amplitude can be outputted. The amplitude of the output signal becomes constant, which makes it possible to eliminate delay time between signals or to keep the delay time constant.

DETAILED DESCRIPTION OF THE PREFERRED EMBODIMENTS

First Embodiment

Figure 1A:
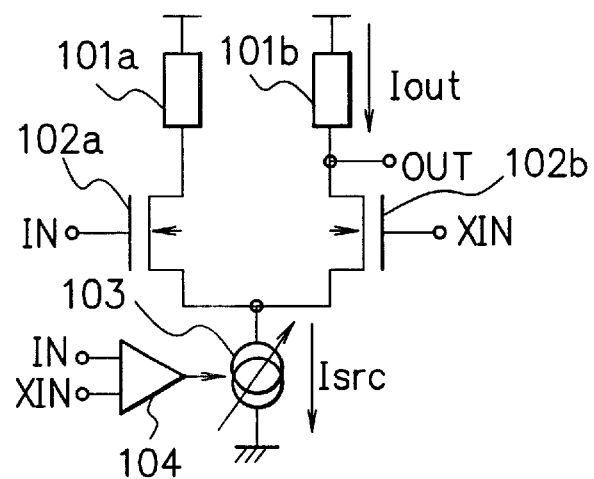
FIG. 1A is a diagram showing a configuration of an operational amplifier according to a first embodiment of the present invention and FIG. 1B is a chart showing its characteristic.

FIG. 1A shows a configuration of an operational amplifier (amplification circuit) according to the first embodiment of the present invention.

An n-channel MOS (metal-oxide-semiconductor) transistor 102a has a gate connected to a positive logic input terminal IN, a source connected to one end of a current source 103, and a drain connected to one end of a load 101a. The other end of the current source 103 is connected to a ground potential. The other end of the load 101a is connected to a positive power source potential Vdd. The power source potential Vdd is higher than the ground potential.

An n-channel MOS transistor 102b has a gate connected to a negative logic input terminal XIN, a source connected to the aforesaid one end of the current source 103, and a drain connected to an output terminal OUT and one end of a load 101b. The other end of the load 101b is connected to the power source potential Vdd.

A positive logic input signal Vin which is inputted to the positive logic input terminal IN and a negative logic input signal Vxin which is inputted to the negative logic input terminal XIN mutually compose differential signals. In other words, both signals are signals whose logics are opposite to each other.

The transistors 102a and 102b make a pair and the loads 101a and 101b also make a pair. The loads 101a and 101b are resistances, for example, and the resistances may be realized by using MOS transistors.

The current source 103 is a variable current source for varying a current to be supplied in accordance with an output from an operational amplifier 104. The operational amplifier 104 has a first input connected to the aforesaid positive logic input terminal IN and a second input connected to the aforesaid negative logic input terminal XIN and outputs a voltage in accordance with the difference between the positive logic input signal Vin and the negative login input signal.

Figure 1B:
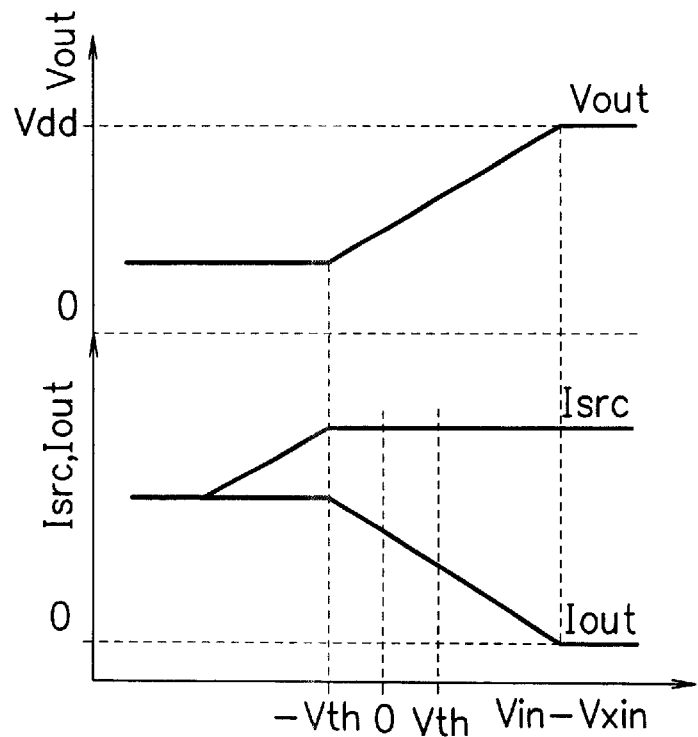

FIG. 1B is a chart showing the operation of the operational amplifier in FIG. 1A. The horizontal axis represents a differential voltage Vin−Vxin and the vertical axis represents currents Isrc and Iout and a voltage Vout. The current Isrc is a current flowing through the current source 103. The current Iout is a current flowing through the load 101b. The output voltage Vout is a voltage of the output terminal OUT. When a resistance value of the load 101b is shown by R, the output voltage Vout is expressed by the following formula and becomes a signal having the same logic as that of the positive logic input signal Vin.

$$Vout = Vdd - Iout \times R$$

Figure 7A:
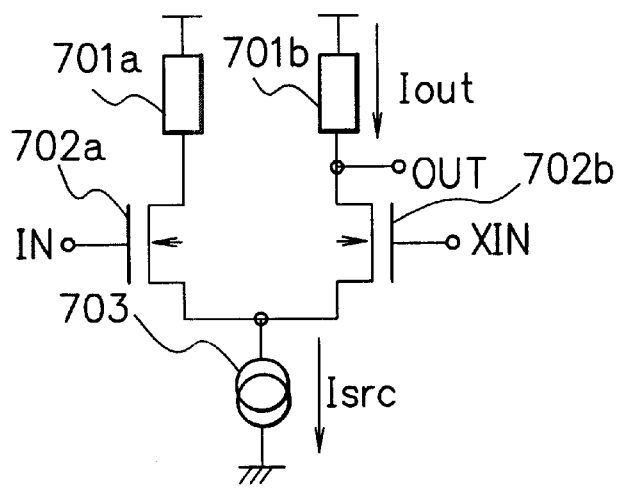
FIG. 7A is a diagram showing a configuration of an operational amplifier in a prior art and FIG. 7B is a chart showing its characteristic.
Figure 7B:
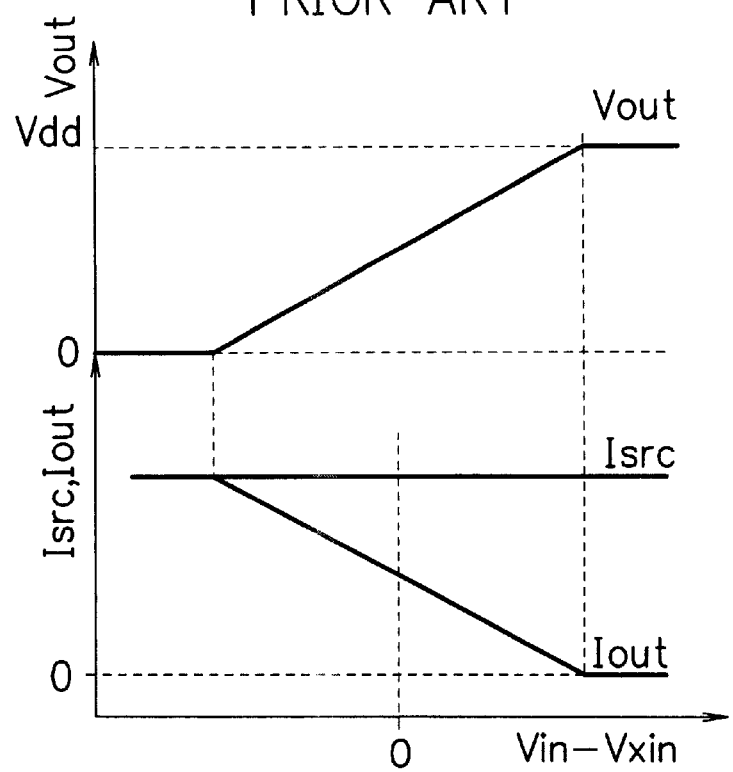
Figure 8:
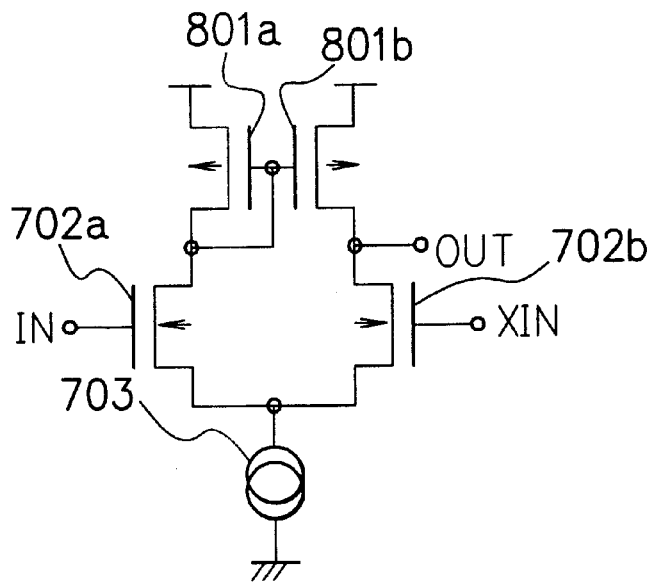
FIG. 8 is a diagram showing a configuration of another operational amplifier in the prior art.
Figure 9:
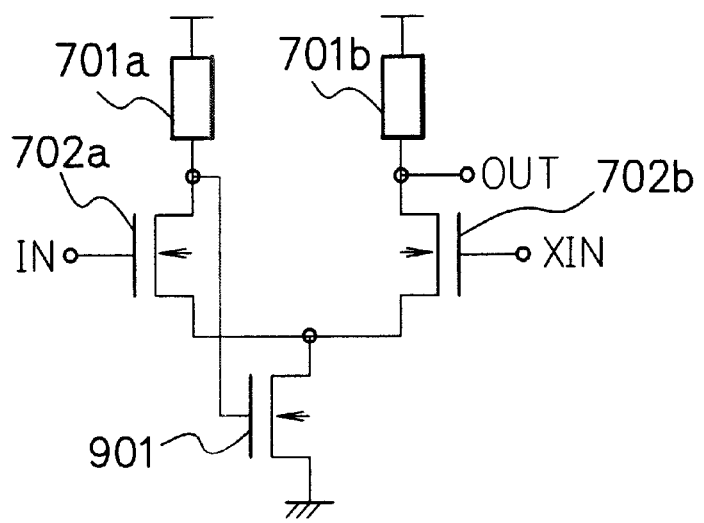
FIG. 9 is a diagram showing a configuration of still another operational amplifier in the prior art.

As shown in FIG. 7B, if the current Isrc is constant, the current Iout varies lineally in accordance with the differential voltage Vin−Vxin when the differential voltage Vin−Vxin is in a predetermined range.

In this embodiment, the current Isrc is controlled so as to maintain the current Iout at a constant value when the differential voltage Vin−Vxin is smaller than a negative threshold (−Vth V). More specifically, the current Isrc remains at a constant value when the differential voltage Vin−Vxin is equal to or larger than the negative threshold (−Vth V), while decreases lineally and thereafter becomes at the same constant value as that of the current Iout when the differential voltage Vin−Vxin is smaller than the negative threshold (−Vth V). The current source 103 supplies the current Isrc as described above in accordance with the output from the operational amplifier 104.

Figure 10:
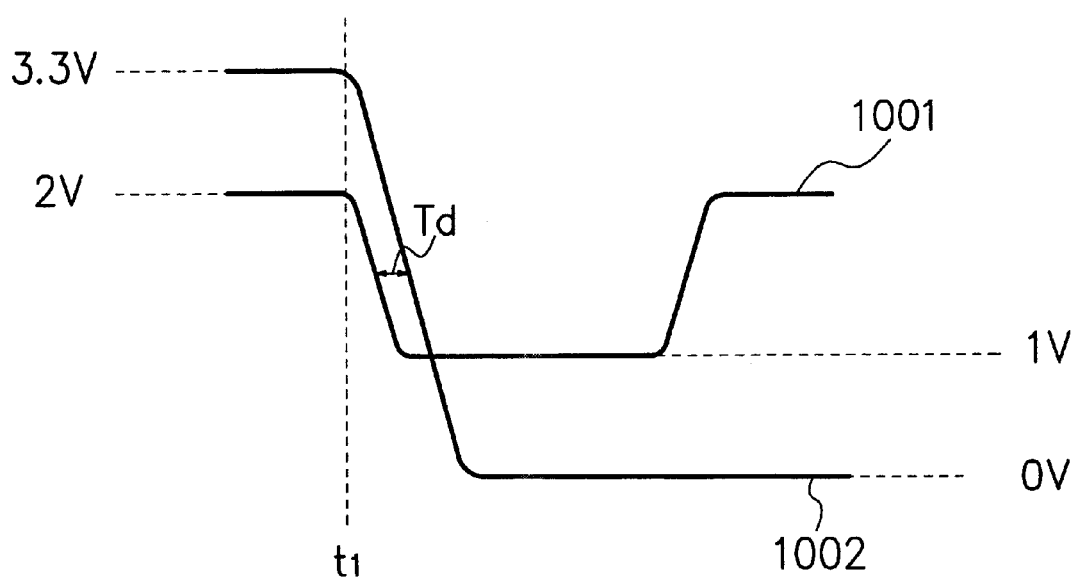
FIG. 10 is a chart showing waveforms of a clock and data having the different amplitude.

Thus, the current Iout is controlled at the constant value and the output voltage Vout is also controlled at a constant value when the differential voltage Vin−Vxin is smaller than the negative threshold (−Vth V). For example, as shown in FIG. 10, in both of a case in which a signal 1002 whose low level is 0 V is inputted and a case in which a signal 1001 whose low level is 1 V is inputted, a signal whose low level is 1 V can be outputted as the output voltage Vout.

Figure 2A:
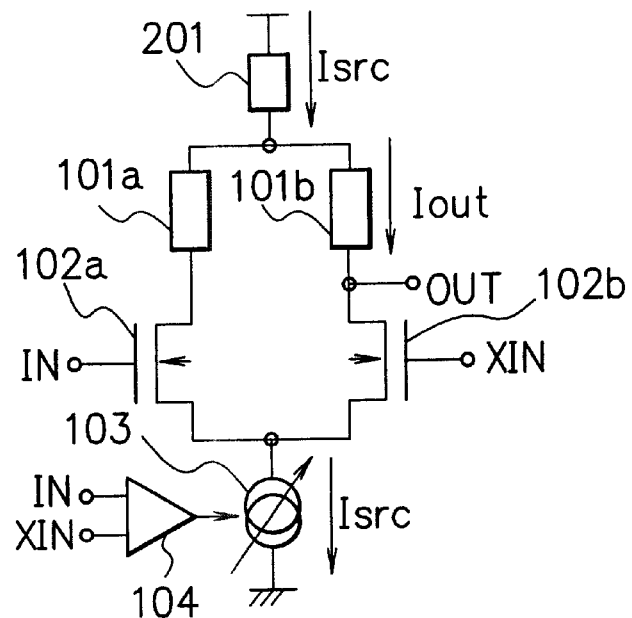
FIG. 2A is a diagram showing a configuration of an operational amplifier according to a second embodiment of the present invention and FIG. 2B is a chart showing its characteristic.

In the first embodiment, a method for controlling a low level potential at a predetermined value has been explained. Subsequently, a method for controlling a high level potential at a predetermined value will be explained as a second embodiment. Incidentally, though the input signal is not limited to a binary logic signal, an example of a binary logic digital signal will be explained for explanatory convenience Second Embodiment FIG. 2A shows a configuration of an operational amplifier according to the second embodiment of the present invention. Only the part of the second embodiment (FIG. 2A) different from that of the first embodiment (FIG. 1A) will be explained. The aforesaid other end of each of the loads 101$a$ and 101$b$ is connected to the power source potential Vdd via a load 201. The current Isrc, which flows through the current source 103, also flows through the load 201. When a resistance value of the load 101$b$ is R1 and a resistance value of the load 201 is R2, the output voltage Vout of the output terminal OUT is expressed by the following formula.

$$Vout = Vdd - Isrc \times R2 - Iout \times R1$$

Further, a method for controlling a current supplied by the current source 103 in accordance with the output from the operational amplifier 104 is different. The controlling method will be explained with reference to FIG. 2B.

Figure 2B:
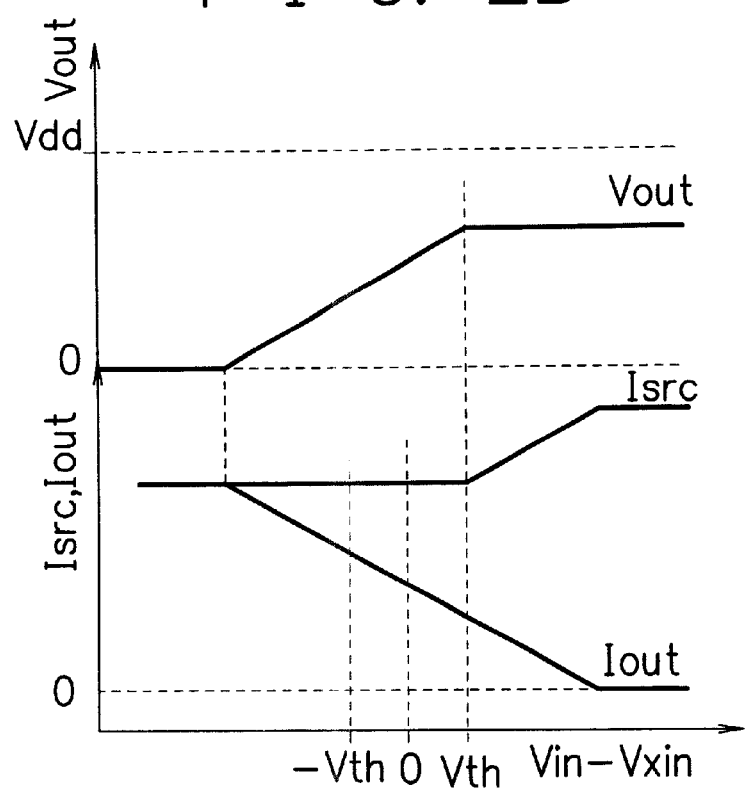

FIG. 2B is a chart showing the operation of the operational amplifier in FIG. 2A. The horizontal axis and the vertical axis are the same as those in FIG. 1B.

As shown in FIG. 7B, if the current Isrc is constant, the output voltage Vout varies lineally in accordance with the differential voltage Vin−Vxin when the differential voltage Vin−Vxin is in the predetermined range.

In this embodiment, the current Isrc is controlled so as to maintain the output voltage Vout at a constant value when the differential voltage Vin−Vxin is larger than a positive threshold (+Vth V). More specifically, the current Isrc remains at a constant value when the differential voltage Vin−Vxin is equal to or smaller than the positive threshold (+Vth V), while increases lineally and thereafter becomes at the constant value when the differential voltage Vin−Vxin is larger than the positive threshold (+Vth V). The current source 103 supplies the current Isrc as described above in accordance with the output from the operational amplifier 104.

Thus, when the differential voltage Vin−Vxin is larger than the positive threshold (+Vth V), the current Iout decreases, and therefore the output voltage Vout can be maintained at the constant value according to the above-described formula of the output voltage Vout by increasing the current Isrc. For example, as shown in FIG. 10, in both the case in which the signal 1002 whose high level is 3.3 V is inputted and the case in which the signal 1001 whose high level is 2 V is inputted, a signal whose high level is 2 V can be outputted as the output voltage Vout.

The method for controlling a low level potential at a predetermined value has been explained in the first embodiment and the method for controlling a high level potential at a predetermined value has been explained in the second embodiment. Subsequently, a method for controlling low level and high level potentials at predetermined values will be explained as a third embodiment.

Third Embodiment

Figure 3A:
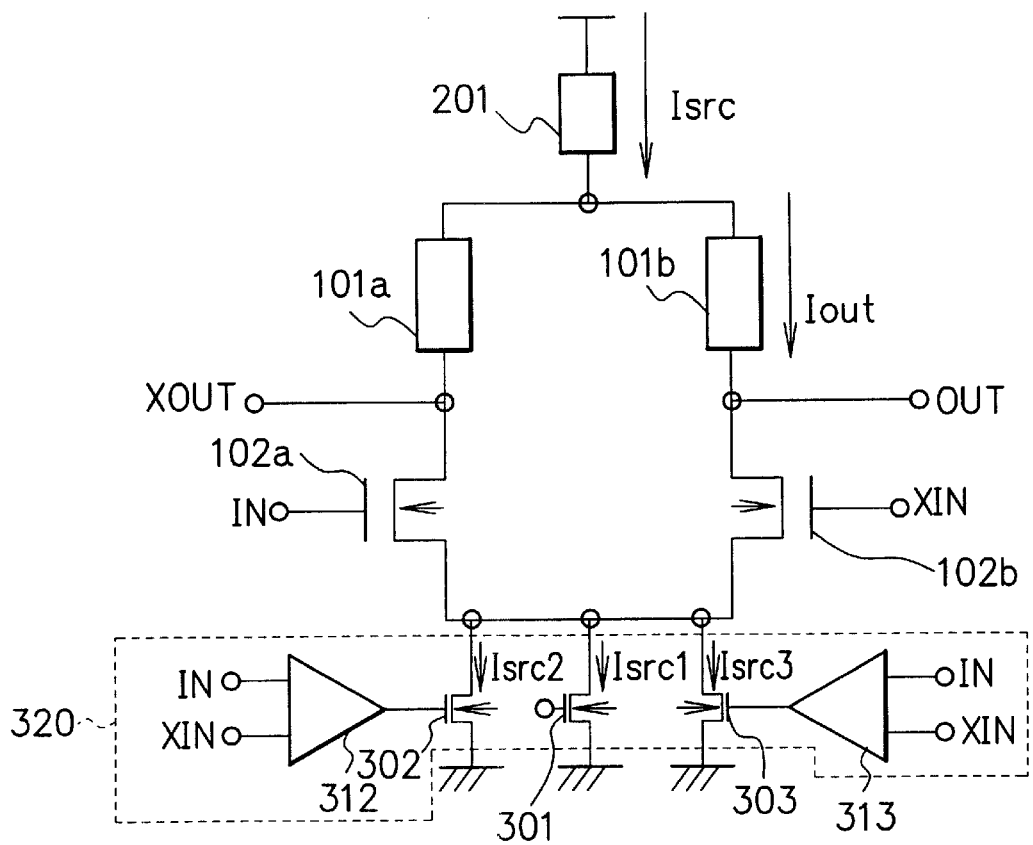
FIG. 3A is a diagram showing a configuration of an operational amplifier according to a third embodiment of the present invention and FIG. 3B is a chart showing its characteristic.

FIG. 3A shows a configuration of an operational amplifier according to the third embodiment of the present invention.

Only the part of the third embodiment (FIG. 3A) different from that of the second embodiment (FIG. 2A) will be explained. One end of a current source 320 is connected to the sources of the transistors 102$a$ and 102$b$ and the other end thereof is connected to the ground potential.

Next, an internal configuration of the current source 320 will be explained. The current source 320 includes an n-channel MOS transistor (constant current source) 301 for supplying a constant current and n-channel MOS transistors (variable current source) 302 and 303 for supplying variable currents.

The transistor 301 has a gate connected to a positive bias potential, a source connected to the ground potential, and a drain connected to the sources of the transistors 102$a$ and 102$b$ and supplies a constant current Isrc1.

The transistor 302 has a gate connected to an output of an operational amplifier 312, a source connected to the ground potential, and a drain connected to the sources of the transistors 102$a$ and 102$b$ and supplies a variable current Isrc2.

The transistor 303 has a gate connected to an output of an operational amplifier 313, a source connected to the ground potential, and a drain connected to the sources of the transistors 102$a$ and 102$b$ and supplies a variable current Isrc3.

The current source 103 and the operational amplifier 104 shown in the first embodiment (FIG. 1A) can be realized by the transistors 301 and 302 and the operational amplifier 312 in FIG. 3A. In this case, the current Isrc flowing through the current source 103 is expressed by the following formula.

$$Isrc = Isrc1 + Isrc2$$

Accordingly, in FIG. 1B, the minimum bias value of the current Isrc becomes the current Isrc1 and the current Isrc is formed by adding the current Isrc2 to the current Isrc1.

Here, though the operational amplifier is generally formed with a characteristic of the output voltage Vout having its center on the differential voltage Vin−Vout=0 as shown in FIG. 7B, the operational amplifier 312 is provided with an offset which moves the linear variation characteristic of the output voltage to the left. In the linear variation part, the output voltage of the operational amplifier 312 increases when the differential voltage Vin−Vout increases. Then, a gate voltage of the transistor 302 increases, the current Isrc2 flowing through the transistor 302 increases, and the current Isrc also increases. Incidentally, a configuration of the operational amplifier 312 provided with the offset will be explained later with reference to FIG. 4A and FIG. 4B.

The current source 103 and the operational amplifier 104 shown in the second embodiment (FIG. 2A) can be realized by the transistors 301 and 303 and the operational amplifier 313 in FIG. 3A. In this case, the current Isrc flowing through the current source 103 is expressed by the following formula.

$$Isrc = Isrc1 + Isrc3$$

Accordingly, in FIG. 2B, the minimum bias value of the current Isrc becomes the current Isrc1 and the current Isrc is formed by adding the current Isrc3 to the current Isrc1.

Here, the operational amplifier 313 is provided with an offset which moves the linear variation characteristic of the output voltage to the right. In the linear variation part, the output voltage of the operational amplifier 313 increases when the differential voltage Vin–Vout increases. Then, a gate voltage of the transistor 303 increases, the current Isrc3 flowing through the transistor 303 increases, and the current Isrc also increases. Incidentally, a configuration of the operational amplifier 313 provided with the offset will be explained later with reference to FIG. 4A and FIG. 4B.

In the third embodiment (FIG. 3A), the current Isrc supplied by the current source 320 is expressed by the following formula.

Isrc=Isrc1+Isrc2+Isrc3

The current Isrc also flows through the load 201. A method for controlling the current Isrc supplied by the current source 320 will be explained with reference to FIG. 3B.

Figure 3B:
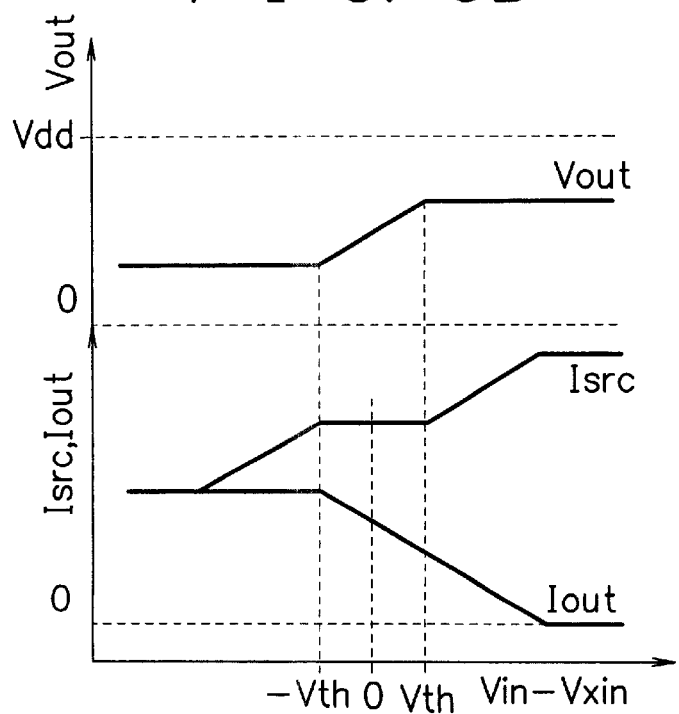

FIG. 3B is a chart showing the operation of the operational amplifier in FIG. 3A. The horizontal axis and the vertical axis are the same as those in FIG. 1B. FIG. 3B has a characteristic in which a characteristic of FIG. 1B and a characteristic of FIG. 2B are merged.

In this embodiment, the current Isrc is controlled to maintain the current Iout at a constant value so that the output voltage Vout is controlled at a constant value when the differential voltage Vin–Vxin is smaller than the negative threshold (–Vth V), similarly to the first embodiment (FIG. 1A and FIG. 1B). When the differential voltage Vin–Vxin is larger than the positive threshold (+Vth V), the current Isrc is controlled to maintain the output voltage Vout at a constant value.

Thus, the output voltage Vout varies lineally in accordance with the differential voltage Vin–Vxin in a range where the differential voltage Vin–Vxin is equal to or larger than the negative threshold (–Vth V) and equal to or smaller than the positive threshold (+Vth V), and the output voltage Vout is controlled at the constant values in an area where the differential voltage Vin–Vxin is smaller than the negative threshold (–Vth V) and in an area where the differential voltage Vin–Vxin is larger than the positive threshold (+Vth V).

As a result, as shown in FIG. 10, for example, in both the case in which the signal 1002 whose low level is 0 V and high level is 3.3 V is inputted and the case in which the signal 1001 whose low level is 1 V and high level is 2 V is inputted, a signal whose low level is 1 V and high level is 2 V can be outputted as the output voltage Vout.

Incidentally, it is preferable that the absolute values of the positive threshold (+Vth V) and the negative threshold (–Vth V) are equal to each other.

The operational amplifier of this embodiment can be used for a small-amplitude input circuit so as to receive a signal from the outside and amplify it. Particularly, it is suitable for a small-amplitude input circuit which receives data and a clock simultaneously.

As shown in FIG. 10, in a prior art, delay time Td occurs between the clock 1001 and the data 1002 which have the different amplitude from each other. Furthermore, there is a problem that the delay time Td varies depending on the magnitude of amplitude of the input signals.

According to this embodiment, a signal having the constant amplitude can be outputted regardless of the magnitude of the amplitude of the input signal. In other words, when the amplitude of the input signal is large, the amplitude is controlled so that an output signal constantly having the same amplitude is outputted. If the amplitude of the output signal is kept constant, the delay time between signals can be eliminated or the delay time is maintained at a constant value.

Moreover, since the amplitude of the output signal does not increase more than required, the time necessary for settling, in which a logic state is stabilized, is shortened, which improves operation speeds of the operational amplifier and the circuit which processes the output voltage thereof.

Incidentally, in FIG. 3A, a negative logic output terminal XOUT may be connected to the drain of the transistor 102a. In this case, the output terminal OUT becomes a positive logic output terminal. A positive logic output signal and a negative logic output signal, which are outputted from the positive logic output terminal OUT and the negative logic output terminal XOUT respectively, mutually compose differential signals.

Figure 4A:
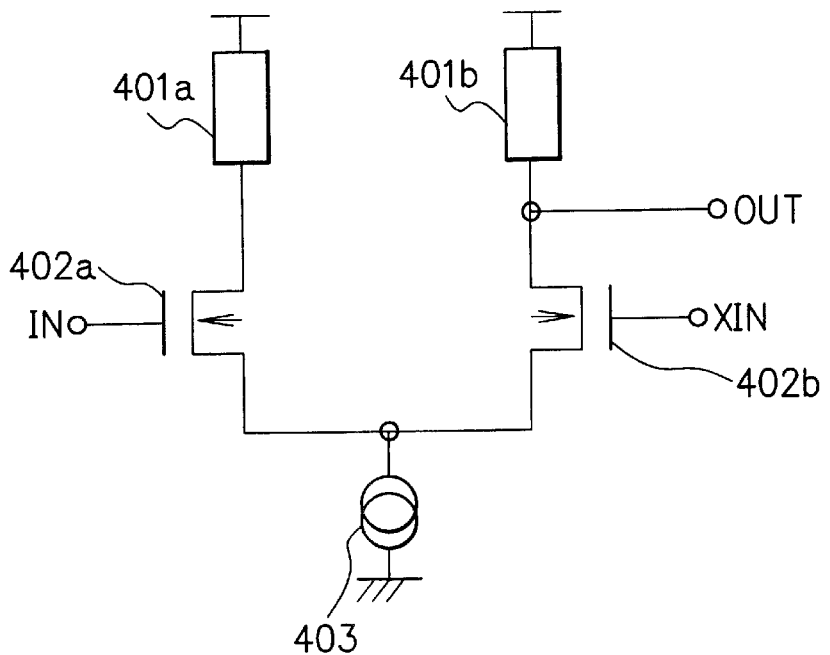
FIG. 4A and FIG. 4B are diagrams showing configurations of operational amplifiers provided with offsets.

FIG. 4A shows a configuration of each of the operational amplifiers 312 and 313 provided with the offset in FIG. 3A.

An n-channel MOS transistor 402a has a gate connected to the positive logic input terminal IN, a source connected to one end of a constant current source 403, and a drain connected to one end of a load 401a. The other end of the constant current source 403 is connected to the ground potential. The other end of the load 401a is connected to the power source potential Vdd.

An n-channel MOS transistor 402b has a gate connected to the negative logic input terminal XIN, a source connected to the aforesaid one end of the current source 403, and a drain connected to the output terminal OUT and one end of a load 401b. The other end of the load 401b is connected to the power source potential Vdd.

The transistors 402a and 402b make a pair and the loads 401a and 401b also make a pair. However, the transistors 402a and 402b are manufactured to have different sizes from each other, thereby enabling the offset to be given to the characteristic of the differential voltage–the output voltage shown in FIG. 1B, FIG. 2B, and FIG. 3B. A direction of the offset can be determined by which one of the transistors 402a and 402b has a larger size.

The output terminal OUT outputs a voltage provided with the offset in accordance with the differential voltage Vin–Vxin. In other words, as shown in FIG. 1B, FIG. 2B, and FIG. 3B, the voltage has the output voltage characteristic in which the horizontal axis of the differential voltage Vin–Vxin is moved to the left or to the right.

Figure 4B:
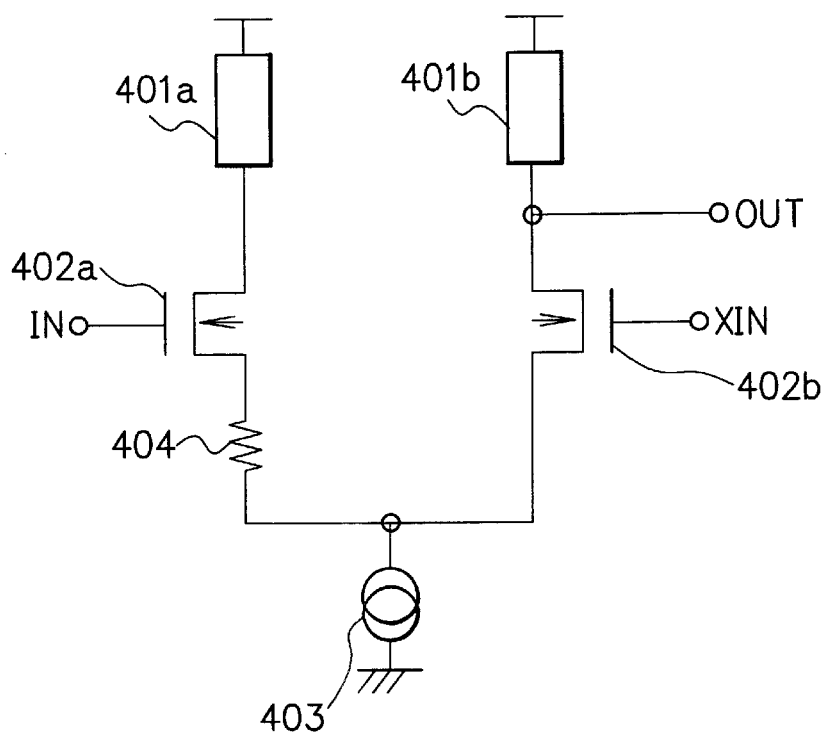

FIG. 4B shows another configuration of each of the operational amplifiers 312 and 313 provided with the offset in FIG. 3A. Though the sizes of the transistors 402a and 402b are made different in FIG. 4A, a resistance 404 is inserted in FIG. 4B alternatively. The resistance 404 is connected between the source of the transistor 402a and the aforesaid one end of the constant current source 403. The resistance 404 may be realized by using a MOS transistor. As thus configured, the offset can be given to the characteristic of the differential voltage–the output voltage, similarly to the case in FIG. 4A.

Instead of the above configuration, if the resistance 404 is connected between the source of the transistor 402b and the aforesaid one end of the constant current source 403, the offset can be given in the opposite direction. Accordingly, the direction of the offset can be determined by whether the resistance 404 is connected in series to the source of the transistor 402a or connected in series to the source of the transistor 402b.

In the first to third embodiments, the examples where n-channel MOS transistors are used as the MOS transistors 102a and 102b, which make the pair, have been explained, but p-channel MOS transistors may be used. An operational amplifier in which the p-channel MOS transistors are used will be explained below.

Fourth Embodiment

Figure 5:
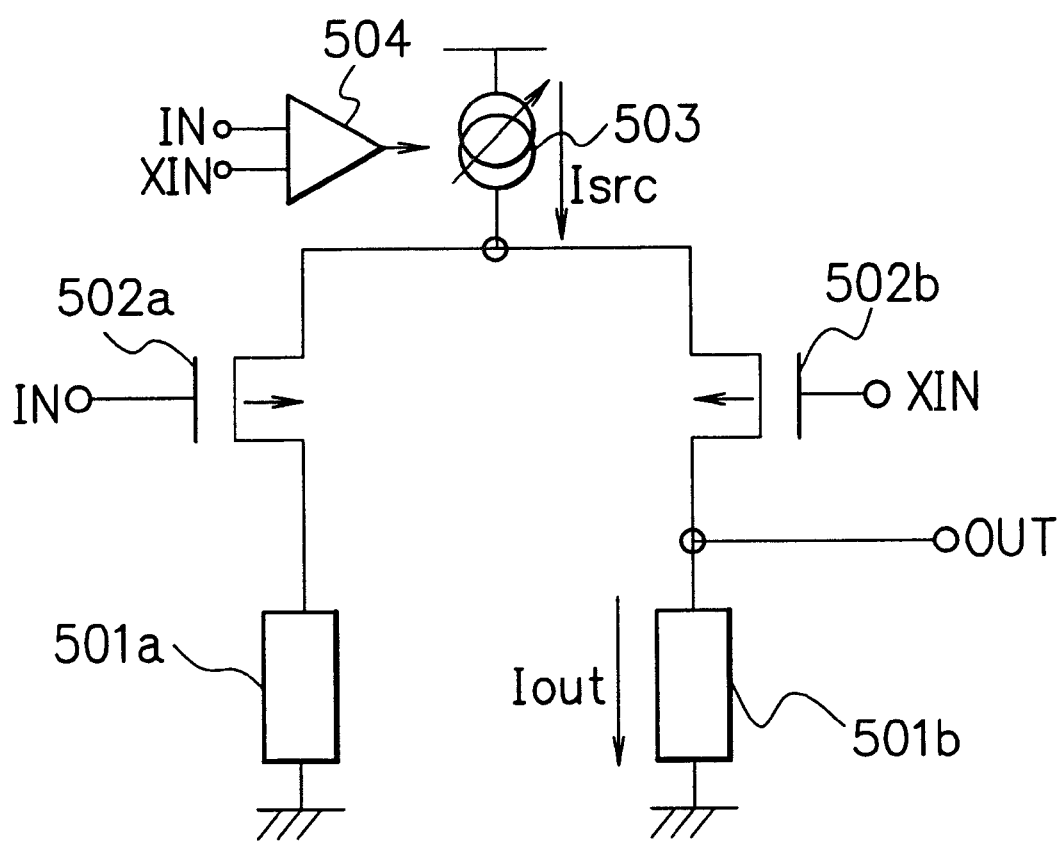
FIG. 5 is a diagram showing a configuration of an operational amplifier according to a fourth embodiment of the present invention.

FIG. 5 shows a configuration of an operational amplifier according to the fourth embodiment of the present invention. In the fourth embodiment, the operational amplifier in the first embodiment (FIG. 1A) is realized by the p-channel MOS transistors.

A p-channel MOS transistor 502a has a gate connected to the positive logic input terminal IN, a source connected to one end of a current source 503, and a drain connected to one end of a load 501a. The other end of the current source 503 is connected to the power source potential Vdd. The other end of the load 501a is connected to the ground potential.

A p-channel MOS transistor 502b has a gate connected to the negative logic input terminal XIN, a source connected to the aforesaid one end of the current source 503, and a drain connected to the output terminal OUT and one end of a load 501b. The other end of the load 501b is connected to the ground potential.

The positive logic input signal Vin and the negative logic input signal Vxin are inputted to the positive logic input terminal IN and the negative logic input terminal XIN respectively. The transistors 502a and 502b make a pair and the loads 501a and 501b also make a pair.

The current source 503 is a variable current source for varying a current to be supplied in accordance with an output from an operational amplifier 504. The operational amplifier 504 has a first input connected to the positive logic input terminal IN described above and a second input connected to the negative logic input terminal XIN described above and outputs a voltage in accordance with the difference between the positive logic input signal Vin and the negative logic input signal Vxin.

The operation of this circuit is the same as the operation in the first embodiment (FIG. 1A and FIG. 1B). However, in the chart in FIG. 1B, the positive and negative symbols of the differential voltage Vin−Vxin on the horizontal axis are reversed.

Specifically, when the differential voltage Vin−Vxin is larger than the positive threshold (+Vth V), the current source 503 supplies the current Isrc which maintains the current Iout flowing through the load 501b constant so as to control the output voltage Vout at a constant value.

When the resistance of the load 501b is R, the output terminal OUT outputs the output voltage Vout in the following formula.

$$Vout = Iout \times R$$

Thus, different from the output voltage Vout in FIG. 1B, the output voltage Vout of this circuit is proportional to the current Iout. The output voltage Vout becomes the signal having the same logic as that of the positive logic input signal Vin.

Fifth Embodiment

Figure 6:
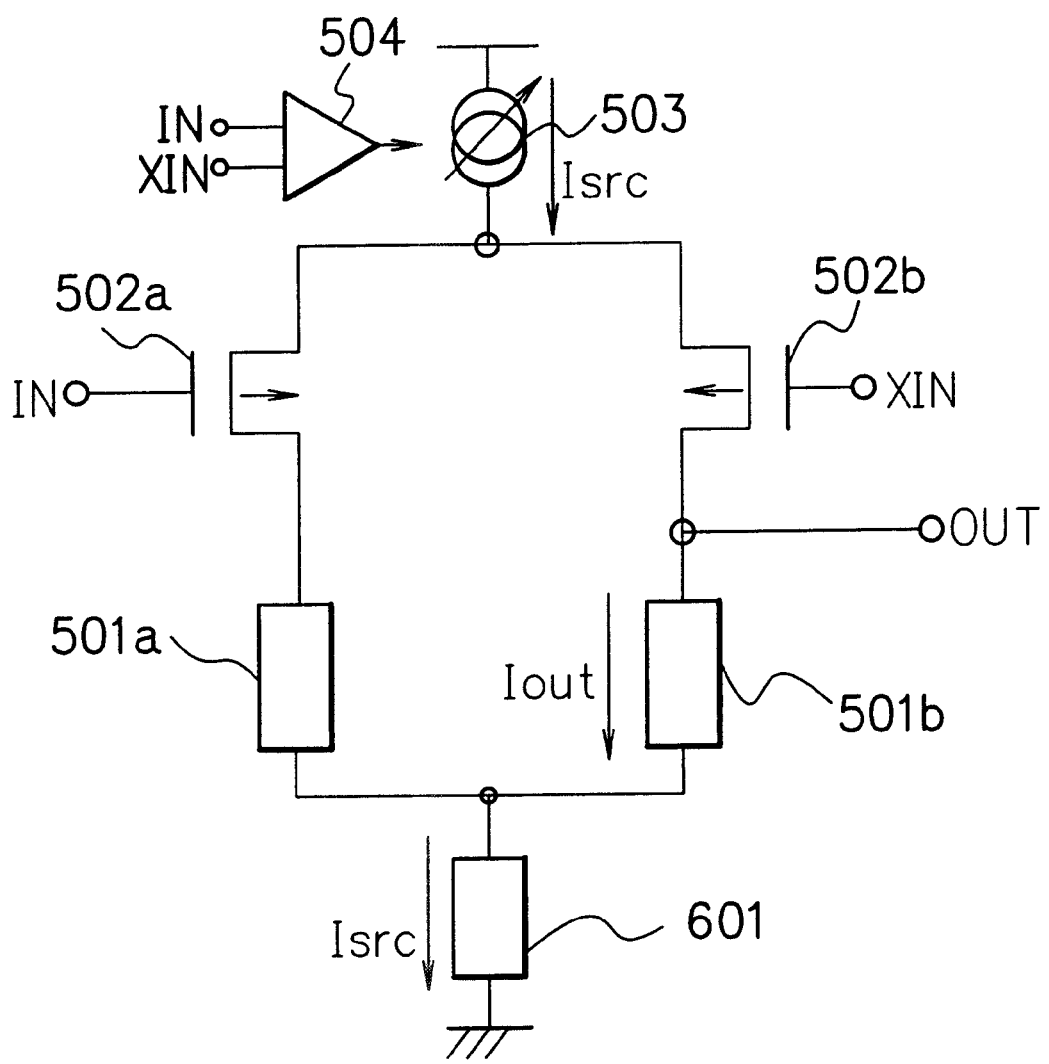
FIG. 6 is a diagram showing a configuration of an operational amplifier according to fifth and sixth embodiments of the present invention.

FIG. 6 shows a configuration of an operational amplifier according to the fifth embodiment of the present invention. In the fifth embodiment, the operational amplifier in the second embodiment (FIG. 2A) is realized by p-channel MOS transistors.

Only the part of the fifth embodiment different from that of the fourth embodiment (FIG. 5) will be explained. The aforesaid other end of each of the loads 501a and 501b is connected to the ground potential via a load 601. The current Isrc, which flows through the current source 503, also flows through the load 601.

The operation of this circuit is the same as the operation in the second embodiment (FIG. 2A and FIG. 2B). However, in the chart in FIG. 2B, the positive and negative symbols of the differential voltage Vin−Vxin on the horizontal axis are reversed. Specifically, when the differential voltage Vin−Vxin is smaller than the negative threshold (−Vth V), the current source 503 controls the current Isrc to maintain the output voltage Vout constant.

When a resistance value of the load 501b is R1 and a resistance value of the load 601 is R2, the output voltage Vout of the output terminal OUT is expressed by the following formula.

$$Vout = Iout \times R1 + Isrc \times R2$$

Thus, different from the output voltage Vout in FIG. 2B, the output voltage Vout also increases when the current Iout increases in an area where the current Isrc remains constant in this circuit. The output voltage Vout becomes the signal having the same logic as that of the positive logic input signal Vin.

Sixth Embodiment

In an operational amplifier according to the sixth embodiment of the present invention, the operational amplifier in the third embodiment (FIG. 3A) is realized by p-channel MOS transistors, similarly to the circuit in FIG. 6. In the circuit in FIG. 6, the current source 503 and the operational amplifier 504 have the same configurations as those of the current source 320 in FIG. 3A.

The operation of this circuit is the same as the operation in the third embodiment (FIG. 3A and FIG. 3B). However, in the chart in FIG. 3B, the positive and negative symbols of the differential voltage Vin−Vxin on the horizontal axis are reversed. Specifically, when the differential voltage Vin−Vxin is larger than the positive threshold (+Vth V) and smaller than the negative threshold (−Vth V), the current source 503 controls the current Isrc to maintain the output voltage Vout constant.

When the resistance value of the load 501b is R1 and the resistance value of the load 601 is R2, the output voltage Vout of the output terminal OUT is expressed by the following formula.

$$Vout = Iout \times R1 + Isrc \times R2$$

Thus, in this circuit, different from the output voltage Vout in FIG. 3B, the output voltage Vout also increases when the current Iout increases in the area where the current Isrc remains constant. The output voltage Vout becomes the signal having the same logic as that of the positive logic input signal Vin.

According to the first to sixth embodiments, the current source supplies a constant current when the differential voltage is in a predetermined range and varies the current to be supplied when the differential voltage is beyond the range so that the voltage of the output terminal can be controlled at a constant value when the differential voltage is beyond the predetermined range. As a result, when the amplitude of an input signal is large, the amplitude is controlled so that an output signal constantly having the same amplitude can be outputted. If the amplitude of the output signal remains constant, the delay time between signals can be eliminated or the delay time can be kept constant.

Furthermore, since the amplitude of the output signal does not increase more than required, the time necessary for settling, in which the logic state is stabilized, is shortened, which improves the operation speeds of the operational amplifier and the circuit which processes the output voltage thereof.

Incidentally, in the first to sixth embodiments, the examples in which the positive logic input signal Vin and the negative logic input signal Vxin are inputted to the positive logic input terminal IN and the negative logic input terminal XIN respectively have been explained, but the present invention is not limited to this. Even if a fixed reference potential is inputted either to the positive logic input terminal IN or to the negative logic input terminal XIN, the same output voltage Vout can be outputted from the output terminal OUT.

The present embodiments are to be considered in all respects as illustrative and not restrictive, and all changes which come within the meaning and range of equivalency of the claims are therefore intended to be embraced therein. The invention may be embodied in other specific forms without departing from the sprit or essential characteristics thereof.

As explained above, the current source supplies a constant current to a first and/or second load when the difference in voltage between a first and second input terminals is in a predetermined range, and varies the current to be supplied to the first and/or second load when the difference in voltage is beyond the range so that a voltage of an output terminal can be controlled at a constant value when the difference in voltage is beyond the predetermined range. As a result, when the amplitude of an input signal is large, the amplitude is controlled so that an output signal constantly having the same amplitude can be outputted. If the amplitude of the output signal is maintained constant, it becomes possible to eliminate the delay time between signals or to keep the delay time at a constant value.

What is claimed is:

1. An amplification circuit, comprising:
   a first MOS transistor having a gate to which a first input terminal for inputting a positive logic input signal is connected and a drain to which a first load is connected;
   a second MOS transistor having a gate to which a second input terminal for inputting a negative logic input signal, which composes differential input signals with the positive logic input signal, is connected and a drain to which an output terminal and a second load are connected, and pairing up with said first MOS transistor; and
   a current source to which sources of said first and second MOS transistors are connected, for supplying a constant current to the first and/or second load when a difference in voltages between the first and second input terminals is equal to or greater than a predetermined negative threshold, and supplying a variable current to the first and/or second load when the difference in the voltages is smaller than said predetermined negative threshold,
   wherein one end of each of the first and second loads is connected to the drains of said first and second MOS transistors respectively and the other end thereof is connected to a first potential via a third load or directly,
   wherein one end of said current source is connected to the sources of said first and second MOS transistors and the other end thereof is connected to a second potential,
   wherein said first and second MOS transistors are n-channel MOS transistors, and
   wherein said current source supplies the variable current which causes a voltage of the output terminal to be constant when the difference in the voltages between the first and second input terminals is smaller than the predetermined negative threshold.

2. The amplification circuit according to claim 1, wherein said current source supplies the variable current which causes a current to be supplied to the second load to be constant when the difference in the voltages between the first and second input terminals is smaller than the predetermined negative threshold.

3. An amplification circuit, comprising:
   a first MOS transistor having a gate to which a first input terminal for inputting a positive logic input signal is connected and a drain to which a first load is connected:
   a second MOS transistor having a gate to which a second input terminal for inputting a negative logic input signal, which composes differential input signals with the positive logic input signal, is connected and a drain to which an output terminal and a second load are connected, and pairing up with said first MOS transistor; and
   a current source to which sources of said first and second MOS transistors are connected, for supplying a constant current to the first and/or second load when a difference in voltages between the first and second input terminals is equal to or less than a predetermined positive threshold, and supplying a variable current to the first and/or second load when the difference in the voltages is greater than said predetermined positive threshold,
   wherein one end of each of the first and second loads is connected to the drains of said first and second MOS transistors respectively and the other end thereof is connected to a first potential via a third load,
   wherein one end of said current source is connected to the sources of said first and second MOS transistors and the other end thereof is connected to a second potential,
   wherein said first and second MOS transistors are n-channel MOS transistors, and
   wherein said current source supplies the variable current which causes a voltage of the output terminal to be constant when the difference in the voltages between the first and second input terminals is greater than the predetermined positive threshold.

4. An amplification circuit, comprising:
   a first MOS transistor having a gate to which a first input terminal for inputting a positive logic input signal is connected and a drain to which a first load is connected;
   a second MOS transistor having a gate to which a second input terminal for inputting a negative logic input signal, which composes differential input signals with the positive logic input signal, is connected and a drain to which an output terminal and a second load are connected, and pairing up with said first MOS transistor, and
   a current source to which sources of said first and second MOS transistors are connected, for supplying a constant current to the first and/or second load when a difference in voltages between the first and second input terminals is between predetermined negative and positive thresholds, and supplying a variable current to the first and/or second load when the difference in the voltages is smaller than said predetermined negative threshold or greater than said predetermined positive threshold,
   wherein one end of each of the first and second loads is connected to the drains of said first and second MOS transistors respectively and the other end thereof is connected to a first potential via a third load, wherein one end of said current source is connected to the sources of said first and second MOS transistors and the other end thereof is connected to a second potential, wherein said first and second MOS transistors are n-channel MOS transistors, and wherein, when the difference in the voltages between the first and second input terminals is smaller than said negative threshold or greater than said positive threshold, said current source supplies the variable current which causes an output voltage of the output terminal to be constant at first and second output voltage values, respectively.

5. The amplification circuit according to claim 4,
wherein absolute values of the negative and positive thresholds are equal to each other.

6. The amplification circuit according to claim 5,
wherein the output voltage of the output terminal varies in accordance with the difference in the voltages between the first and second input terminals when the difference in the voltages is between the negative threshold and the positive threshold.

7. The amplification circuit according to claim 6,
wherein the first potential is higher than the second potential.

8. The amplification circuit according to claim 7,
wherein said current source functions as a constant current source for supplying the constant current and a variable current source for supplying the variable current.

9. The amplification circuit according to claim 8,
wherein the variable current source has an operational amplifier provided with an offset determined by sizes of MOS transistors within the operational amplifier.

10. The amplification circuit according to claim 8,
wherein the variable current source has an operational amplifier to which an offset is provided by connecting in series a resistance to a source of one MOS transistor within the operational amplifier.

11. An amplification circuit, comprising:
a first MOS transistor having a gate to which a first input terminal for inputting a positive logic input signal is connected and a drain to which a first load is connected;

a second MOS transistor having a gate to which a second input terminal for inputting a negative logic input signal, which composes differential input signals with the positive logic input signal, is connected and a drain to which an output terminal and a second load are connected, and pairing up with said first MOS transistor, and a current source to which sources of said first and second MOS transistors are connected, for supplying a constant current to the first and/or second load when a difference in voltages between the first and second input terminals is equal to or greater than a predetermined negative threshold, and supplying a variable current to the first and/or second load when the difference in the voltages is smaller than said predetermined negative threshold, wherein one end of each of the first and second loads is connected to the drains of said first and second MOS transistors respectively and the other end thereof is connected to a first potential via a third load or directly, wherein one end of said current source is connected to the sources of said first and second MOS transistors and the other end thereof is connected to a second potential, wherein said first and second MOS transistors are p-channel MOS transistors, and wherein said current source supplies the variable current which causes a voltage of the output terminal to be constant when the difference in the voltages between the first and second input terminals is smaller than said predetermined negative threshold.

12. The amplification circuit according to claim 11,
wherein said current source supplies the variable current which causes the current to be supplied to the second load to be constant when the difference in the voltages between the first and second input terminals is less than the predetermined negative threshold.

13. An amplification circuit, comprising:
a first MOS transistor having a gate to which a first input terminal for inputting a positive logic input signal is connected and a drain to which a first load is connected;

a second MOS transistor having a gate to which a second input terminal for inputting a negative logic input signal, which composes differential input signals with the positive logic input signal, is connected and a drain to which an output terminal and a second load are connected, and pairing up with said first MOS transistor; and a current source to which sources of said first and second MOS transistors are connected, for supplying a constant current to the first and/or second load when a difference in voltages between the first and second input terminals is equal to or less than a predetermined positive threshold, and supplying a variable current to the first and/or second load when the difference in the voltages is greater than said predetermined positive threshold, wherein one end of each of the first and second loads is connected to the drains of said first and second MOS transistors respectively and the other end thereof is connected to a first potential via a third load, wherein one end of said current source is connected to the sources of said first and second MOS transistors and the other end thereof is connected to a second potential, wherein said first and second MOB transistors are p-channel MOS transistors, and wherein said current source supplies a current which causes a voltage of the output terminal to be constant when the difference in the voltages between the first and second input terminals is greater than said predetermined positive threshold.

14. An amplification circuit, comprising:
a first MOS transistor having a gate to which a first input terminal for inputting a positive logic input signal is connected and a drain to which a first load is connected:

a second MOS transistor having a gate to which a second input terminal for inputting a negative logic input signal, which composes differential input signals with the positive logic input signal, is connected and a drain to which an output terminal and a second load are connected, and pairing up with said first MOS transistor; and a current source to which sources of said first and second MOS transistors are connected, for supplying a constant current to the first and/or second load when a difference in voltages between the first and second input terminals is between predetermined negative and positive thresholds, and supplying a variable current to the first and/or second load when the difference in the voltages is smaller than said predetermined negative threshold or greater than said positive threshold, wherein one end of each of the first and second loads is connected to the drains of said first and second MOS transistors respectively and the other end thereof is connected to a first potential via a third load, wherein one end of said current source is connected to the sources of said first and second MOS transistors and the other end thereof is connected to a second potential, wherein said first end second MOS transistors are p-channel MOS transistors, and wherein, when the difference in the voltages between the first and second input terminals is greater than said positive threshold or smaller than said negative threshold, said current source supplies the variable current which causes an output voltage of the output terminal to be constant at first and second output voltage values, respectively.

15. The amplification circuit according to claim 14, wherein absolute values of the negative and positive thresholds are equal to each other.

16. The amplification circuit according to claim 15, wherein the output voltage of the output terminal varies in accordance with the difference in the voltages between the first and second input terminals when the difference in the voltages is between the negative threshold and the positive threshold.

17. The amplification circuit according to claim 16, wherein the first potential is lower than the second potential.

18. The amplification circuit according to claim 17, wherein said current source functions as a constant current source for supplying the constant current and a variable current source for supplying the variable current.

19. The amplification circuit according to claim 18, wherein the variable current source has an operational amplifier provided with an offset determined by sizes of MOS transistors within the operational amplifier.

20. The amplification circuit according to claim 18, wherein the variable current source has an operational amplifier provided with an offset by connecting in series a resistance to a source of one MOS transistor within the operational amplifier.

* * * * *